United States Patent
Uchino et al.

(10) Patent No.: US 7,429,525 B2
(45) Date of Patent: Sep. 30, 2008

(54) FABRICATION PROCESS OF A SEMICONDUCTOR DEVICE

(75) Inventors: Yasunori Uchino, Kawasaki (JP); Kazuo Kawamura, Kawasaki (JP); Naoyoshi Tamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 361 days.

(21) Appl. No.: 11/434,202

(22) Filed: May 16, 2006

(65) Prior Publication Data
US 2007/0166975 A1     Jul. 19, 2007

(30) Foreign Application Priority Data
Jan. 17, 2006   (JP)   .............................. 2006-008945

(51) Int. Cl.
    *H01L 21/3205*   (2006.01)
(52) U.S. Cl. ........................ 438/592; 438/199; 438/369; 438/581; 438/583; 438/682; 257/E21.438; 257/E21.439
(58) Field of Classification Search ................. 438/581, 438/583
    See application file for complete search history.

(56) References Cited

U.S. PATENT DOCUMENTS
2005/0272215 A1* 12/2005 Lee ............................ 438/369

FOREIGN PATENT DOCUMENTS
JP    61-128521    6/1986
JP    2004-356216  12/2004

* cited by examiner

*Primary Examiner*—Charles D. Garber
*Assistant Examiner*—Kyoung Lee
(74) *Attorney, Agent, or Firm*—Westerman, Hattori, Daniels & Adrian, LLP.

(57) ABSTRACT

A method of fabricating a semiconductor device includes the steps of forming a metallic nickel film on a silicon substrate such that the metallic nickel film covers an insulation film on the silicon substrate and a silicon surface of the silicon substrate, annealing the silicon substrate in a silane gas ambient at a temperature not exceeding 220° C. to form a first nickel silicide layer having a composition primarily of $Ni_2Si$ on the silicon surface and a surface of the metallic nickel film, removing the metallic nickel film after the step of forming the nickel silicide layer by a wet etching process, and converting the first nickel silicide layer to a second nickel silicide layer primarily of nickel monosilicide (NiSi) by applying a thermal annealing process.

15 Claims, 16 Drawing Sheets

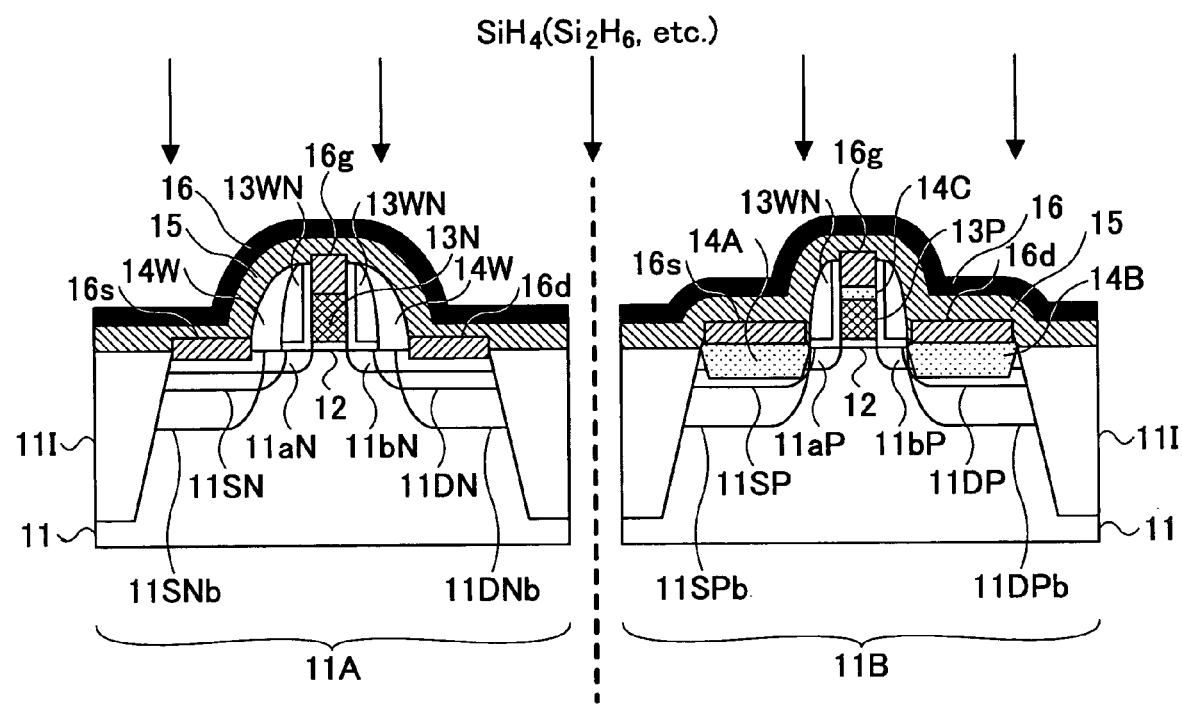
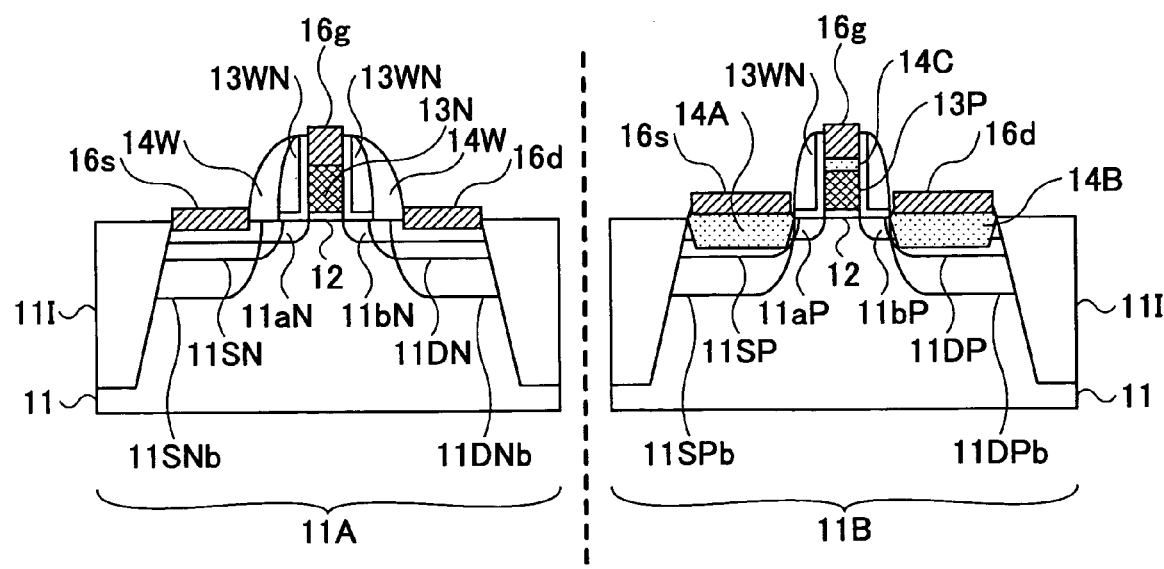

FABRICATION PROCESS OF A SEMICONDUCTOR DEVICE

CROSS-REFERENCE TO RELATED APPLICATION

The present application is based on Japanese priority application No. 2006-008945 filed on Jan. 17, 2006, the entire contents of which are hereby incorporated by reference.

BACKGROUND OF THE INVENTION

The present invention generally relates to semiconductor devices and fabrication process thereof, and especially to the fabrication process of a semiconductor device in which a layer of low-resistance nickel silicide, particularly a nickel silicide layer of the NiSi composition is formed on the diffusion region or gate electrode on a semiconductor substrate.

In the art of MOS semiconductor integrated circuit devices, steady progress is being made with regard to improvement of integration density and miniaturization of device size for the purpose of achieving higher operational speed, further diversity of functions, larger memory capacity, further decrease of electric power consumption, or the like.

Today, there is already realized a semiconductor device having a gate length of 100 nm or less, while with such ultra-miniaturized semiconductor devices, there arise various problems in relation to decrease of the gate length. Thus, innovation of the conventional art is inevitable.

Conventionally, a vertical interconnection structure such as contact structure has been used extensively in semiconductor devices formed on a silicon substrate for electrically interconnecting a diffusion region formed in the silicon substrate with an interconnection pattern.

With such a contact structure, an electric interconnection is made to the surface of the diffusion region by way of a contact plug. Thereby, in order to reduce the contact resistance, it is practiced in the art to form a low-resistance silicide layer on the surface of the diffusion region to which the contact plug makes a contact.

Conventionally, such a silicide layer is formed by a so-called salicide process in which a metal film is deposited on a silicon surface, followed by a thermal annealing process such that there is caused a reaction between the metal film and the silicon surface. After the thermal annealing process, the metal film remaining unreacted is removed by a selective wet etching process.

In the case of ultra-miniaturized semiconductor devices of these days called 65 nm-node generation devices or newer and characterized by the gate length of 35 nm or less, it is preferable to suppress the junction depth of the source/drain diffusion regions to be 100 nm or less in view of the need of suppressing short channel effect.

In relation to this, there is an increasing need of using nickel silicide, which can be formed with thermal annealing process at the temperature of 400° C. or less, in the salicide process, such that the distribution profile of the impurity elements constituting the shallow junction is not modified with the thermal annealing process. In addition, nickel silicide can be formed also on a SiGe mixed crystal region with reliability. Thus, nickel silicide is an indispensable material in the ultra-fast semiconductor devices that achieve improvement of operational speed by way of stressing.

REFERENCES

Reference 1 Japanese Laid-Open Patent Application 61-128521
Reference 2 Japanese Laid-Open Patent Application 2004-356216

SUMMARY OF THE INVENTION

With such an ultra-miniaturized and ultra-fast semiconductor device characterized by the junction depth of 100 nm or less, it is preferable to control the depth of the silicide region formed by the salicide process as small as possible, such that the silicide formation reaction does not take place below the junction interface when forming the silicide layer on the surface of the diffusion region.

Thus, Patent Reference 2 discloses the technology of so-called elevated silicide, in which a silicide formation reaction is caused not only at the interface between the metal film and the silicon surface but also at the top surface of the metal film at the time of the salicide process, by supplying a silane gas simultaneously to the salicide process.

According to this conventional technology of elevated silicide formation, the metal atoms on the surface part of the metallic film are consumed by the silicide formation reaction caused by the silane gas by supplying the silane gas to the surface of the metallic film at the time of the reaction between the metallic film and the silicon surface as noted before, and the amount of the metal atoms causing reaction with the silicon surface is reduced. With this, it becomes possible to reduce the depth of the silicide layer formation region invading into the silicon substrate.

Meanwhile, it was discovered that there arise various unsolved problems not recognized in the art of Patent References 1 and 2 when attempt is made to form a NiSi layer on a surface of diffusion regions while using the conventional technology of elevated silicide formation.

For example, the inventor of the present invention has discovered, in the investigation that constitutes the foundation of the present invention, that there is easily formed a native oxide film on a metallic Ni film when such a metallic Ni film is formed on a surface of a silicon substrate for silicide formation and that the silicide forming reaction of the silane gas is impeded by such a native oxide film.

In order to eliminate this problem, it is necessary to carry out the silicide forming reaction at high temperatures, while silicide formation reaction carried out at such high temperature inevitably invites modification of impurity distribution profile in the shallow diffusion regions.

Further, it was discovered that, in the case silicide formation is conducted at such high temperatures, there is caused uniform silicide formation in the metallic film as a result of the reaction of the silane gas, and thus, the silicide formation takes place also in the part of the metallic nickel film located over an insulation film on the silicon substrate. When such uniform formation of silicide is caused, it becomes difficult to remove the silicide on the insulation film by a selective etching process. When the silicide film on the insulation film is not removed by a selective etching process, there is a possibility that the semiconductor device causes short circuit between the gate electrode and the source region, or between the gate electrode and the drain region.

The present invention provides a film forming process of nickel silicide that uses elevated silicide forming technology and also a fabrication process of a semiconductor device that includes such film forming process of nickel silicide.

In a first aspect, the present invention provides a method of fabricating a semiconductor device including the step of forming a nickel monosilicide layer on a silicon surface defined by an insulation film selectively with a self-aligned process, comprising the steps of:

forming a metallic-nickel film on a silicon substrate such that said metallic nickel film covers said insulation film and said silicon surface;

annealing said silicon substrate in a silane gas ambient at a temperature not exceeding 220° C. to form a first nickel silicide layer having a composition primarily of $Ni_2Si$ on said silicon surface and also on a surface of said metallic nickel film;

removing said metallic nickel film after said step of forming said first nickel silicide layer by a wet etching process; and converting said first nickel silicide layer to a second nickel silicide layer primarily of nickel monosilicide (NiSi) by applying a thermal annealing process.

According to another aspect, the present invention provides a method of fabricating a semiconductor device, comprising the steps of:

forming a device isolation structure on a substrate such that said device isolation structure defines a device region in the form of a silicon surface;

forming a gate electrode over said device region via a gate insulation film formed on said silicon surface in said device region;

forming first and second sidewall insulation films on respective sidewall surfaces of said gate electrode;

forming a source region and a drain region of an identical conductivity type in said silicon substrate at respective outer sides of said first sidewall insulation film and said second sidewall insulation film; and forming first and second nickel monosilicide layers primarily of NiSi on respective surfaces of said source and drain regions, wherein said step of forming said first and second nickel monosilicide layers comprises the steps of:

depositing a metallic nickel film on said substrate to cover said first and second diffusion regions and further said gate electrode including said first and second sidewall insulation films;

annealing said metallic nickel film in a silane gas ambient at a temperature not exceeding 220° C. to form a first nickel silicide layer, a second nickel silicide layer and a third nickel silicide layer of a composition primarily of $Ni_2Si$ respectively on a surface of said source region, a surface of said drain region and also on a surface of said metallic nickel film, removing, after said step of forming said first through third nickel silicide layers, said metallic nickel film by a wet etching process together with said third nickel silicide film; and converting said first and second nickel silicide layers of said source and drain regions respectively to first and second nickel monosilicide layers by conducting a thermal annealing process.

According to the present invention, it becomes possible to form a nickel silicide layer having a composition represented by $Ni_2Si$ at the interface between the silicon surface and the metallic nickel film formed thereon while suppressing the occurrence of silicide formation reaction in the entire metallic silicide film and suppressing at the same time excessive invasion of Ni atoms into the silicon surface from the metallic silicide film, by conducting the silicide forming reaction in a silane gas ambient at a temperature of 220° C. or less. Thus, by converting such a nickel silicide layer to a nickel monosilicide layer of the composition of NiSi by conducting a thermal annealing process, it becomes possible to form a low-resistance nickel monosilicide layer stably with shallow depth.

Other objects and further features of the present invention will become apparent from the following detailed description when read in conjunction with the attached drawings.

BRIEF DESCRIPTION OF THE DRAWINGS

FIGS. 6A-6E are diagrams showing the details of the step of FIG. 5F.

DETAILED DESCRIPTION OF THE INVENTION

First Embodiment

Figure 1A:
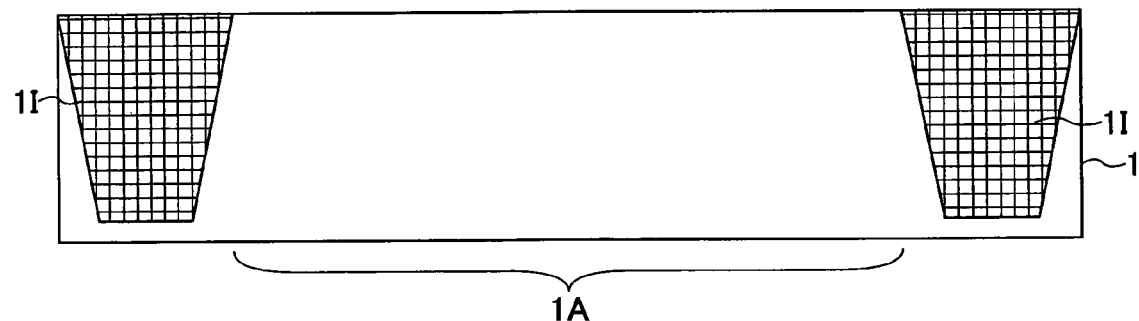
FIGS. 1A-1L are diagrams showing the fabrication process of a semiconductor device according to a first embodiment of the present invention.
Figure 1B:
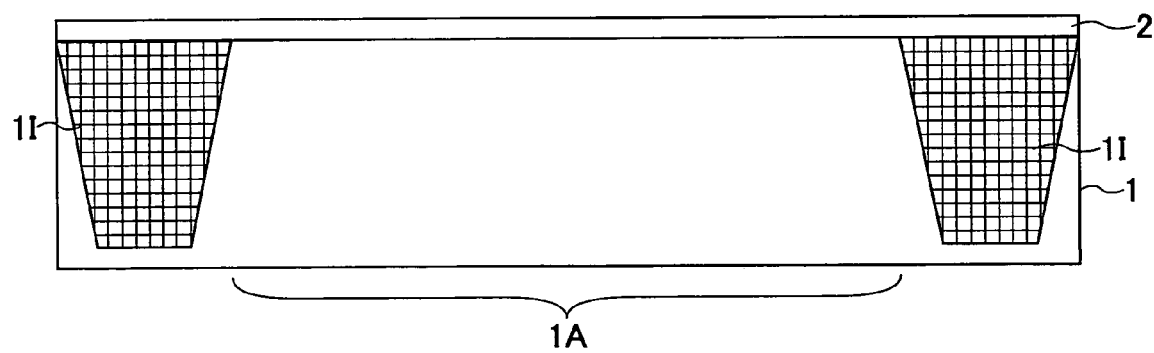
Figure 1C:
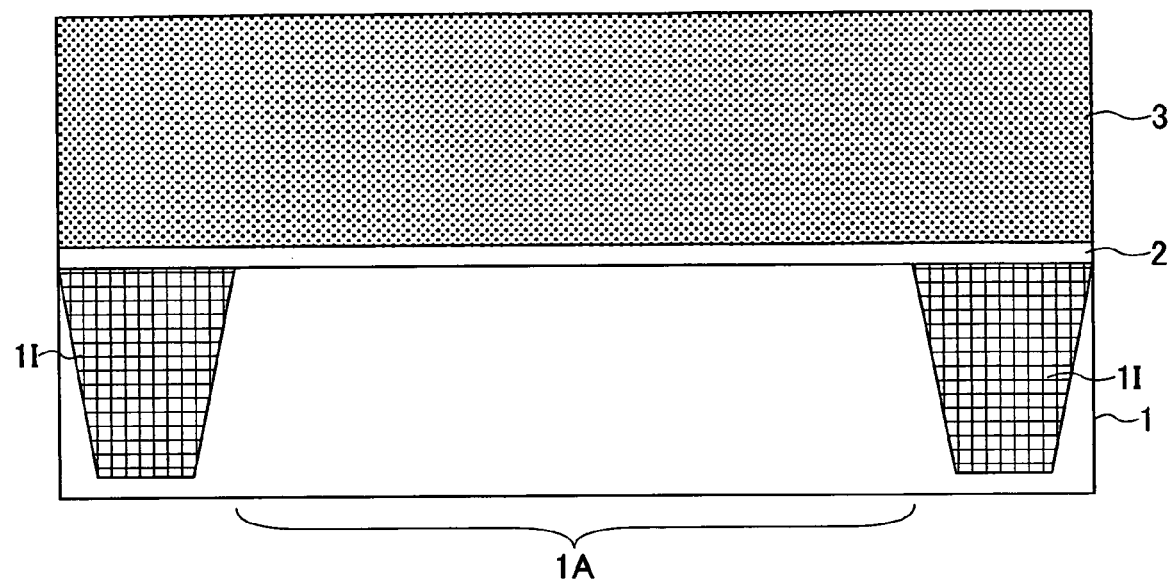
Figure 1D:
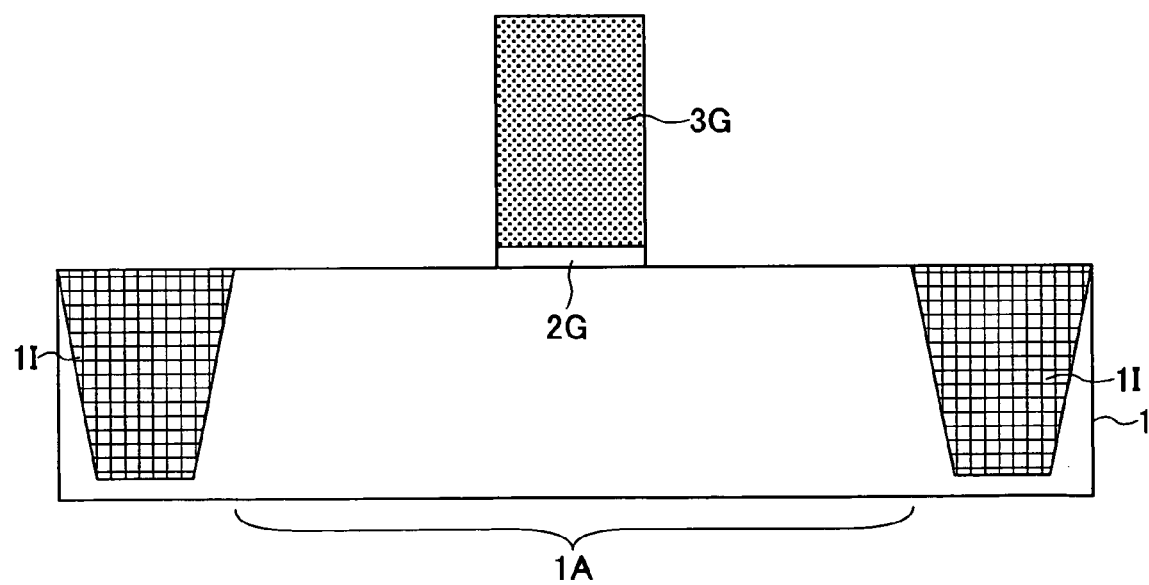
Figure 1E:
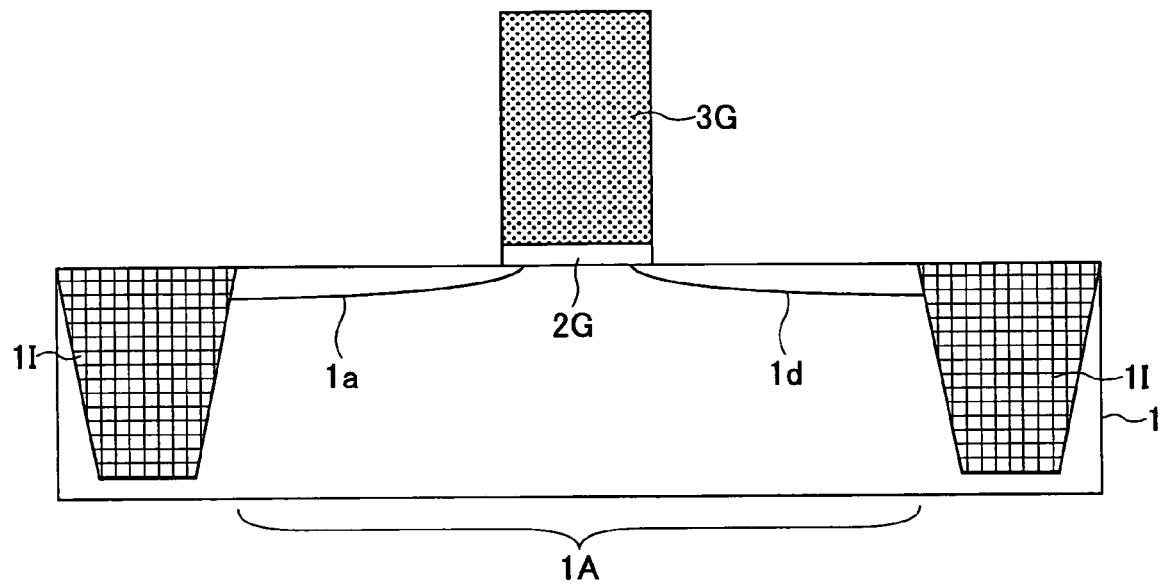
Figure 1F:
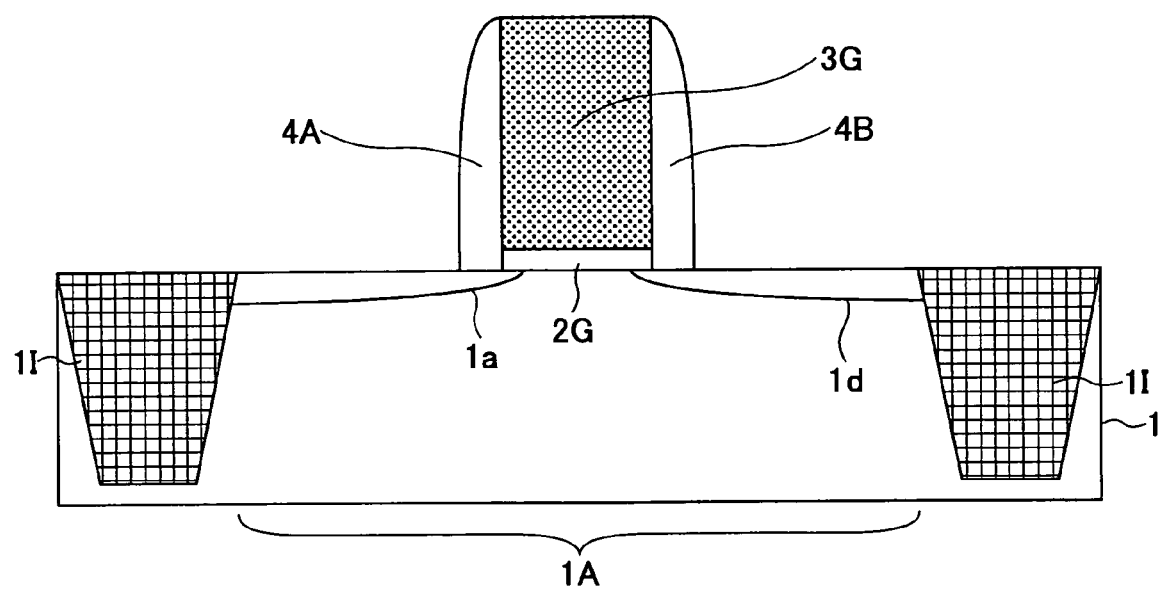
Figure 1G:
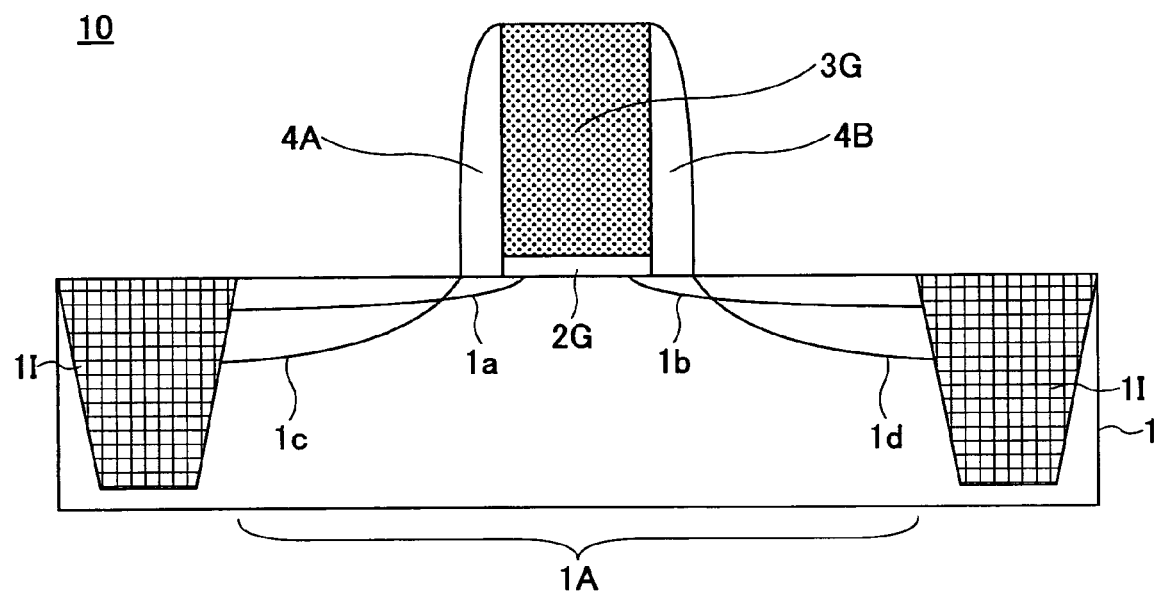
Figure 1H:
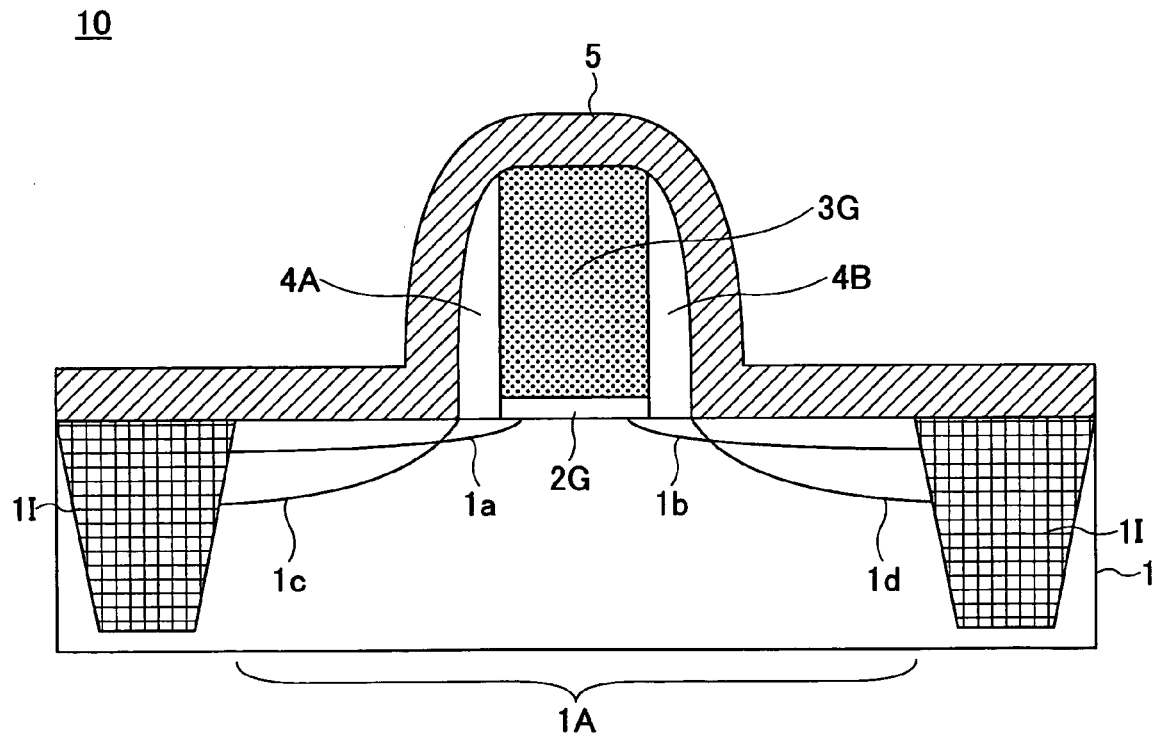
Figure 1I:
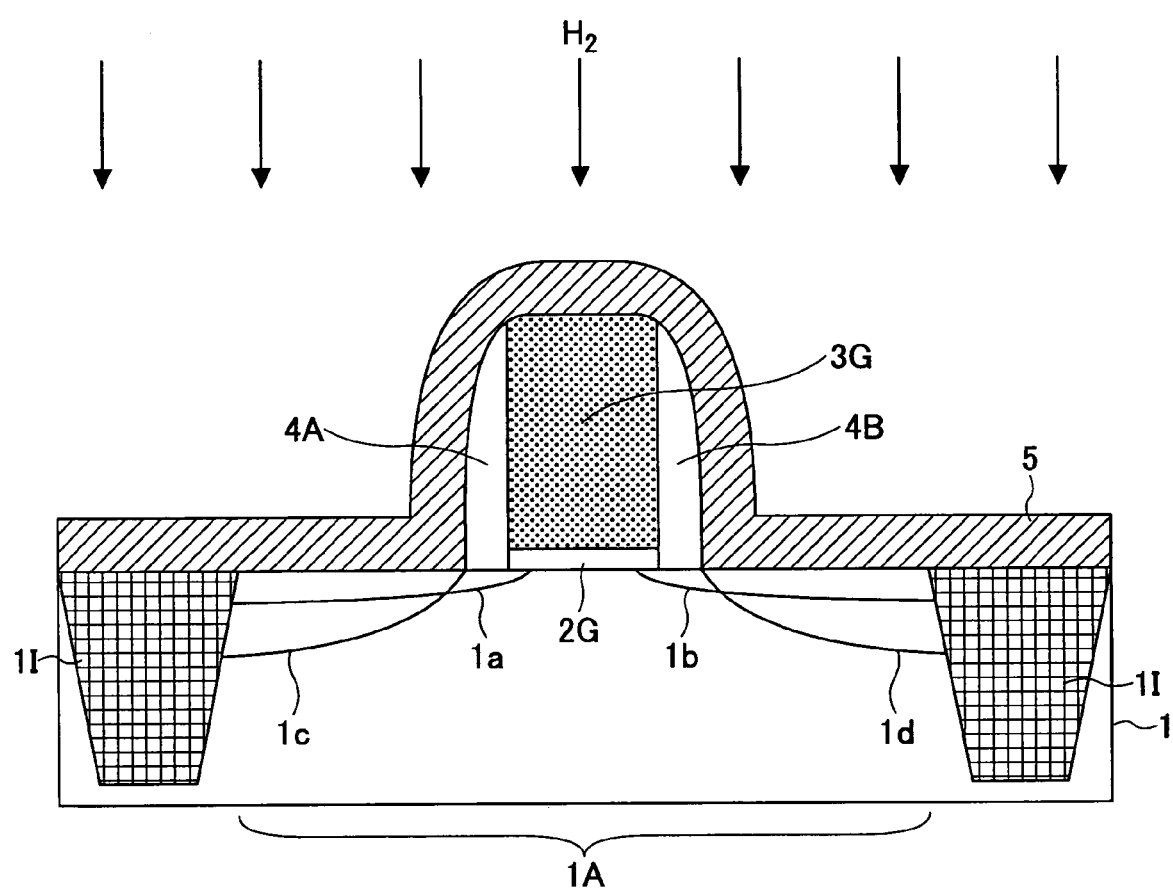
Figure 1J:
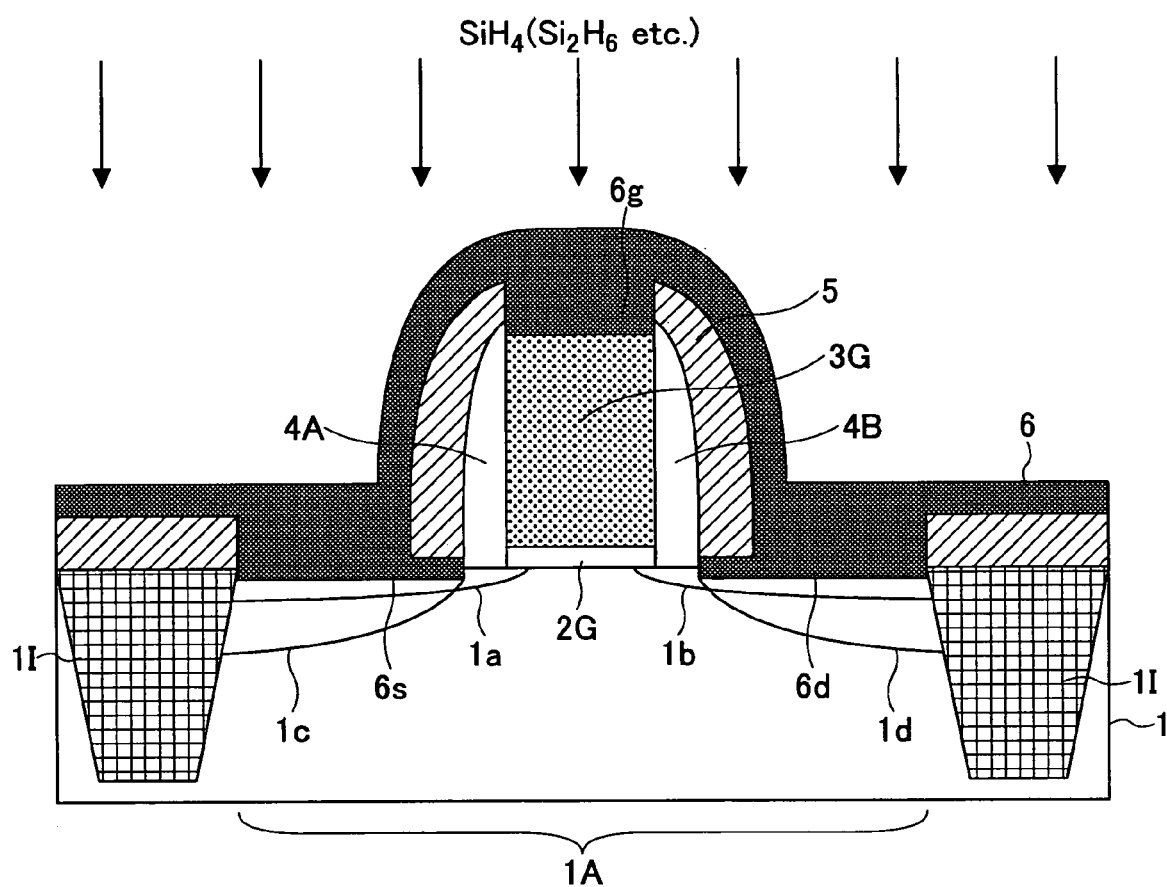
Figure 1K:
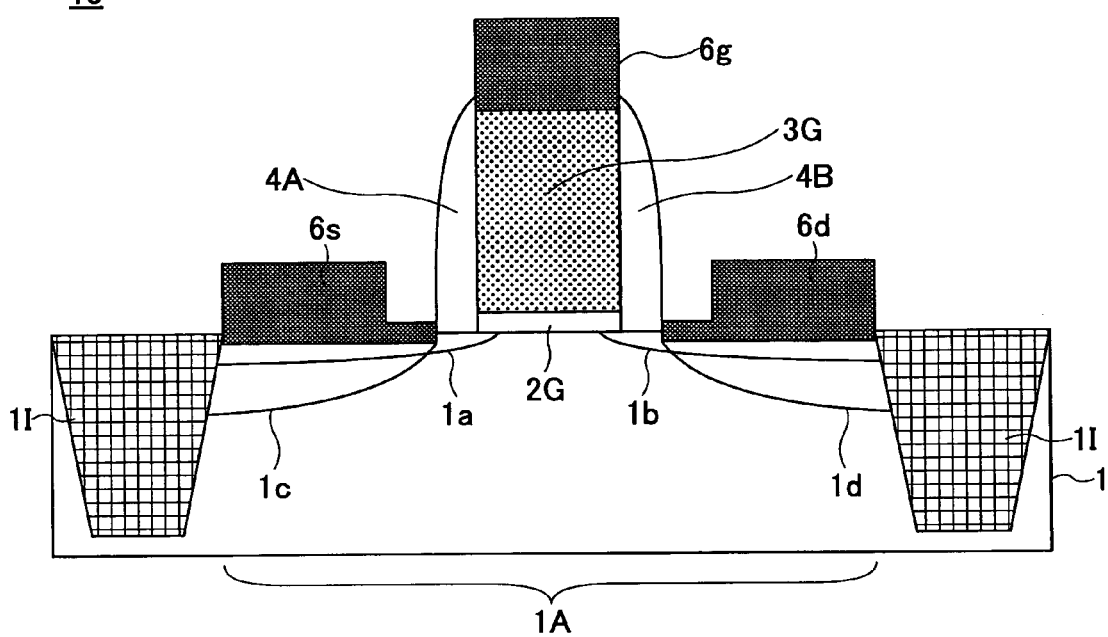
Figure 1L:
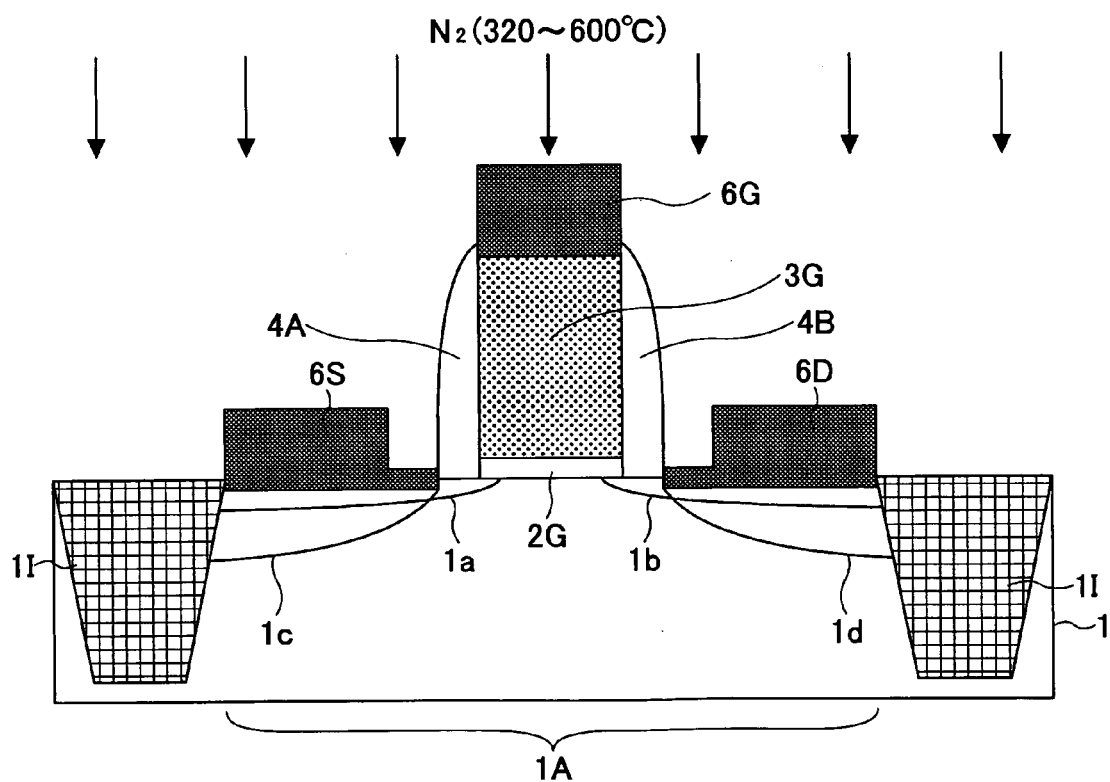
Figure 2:
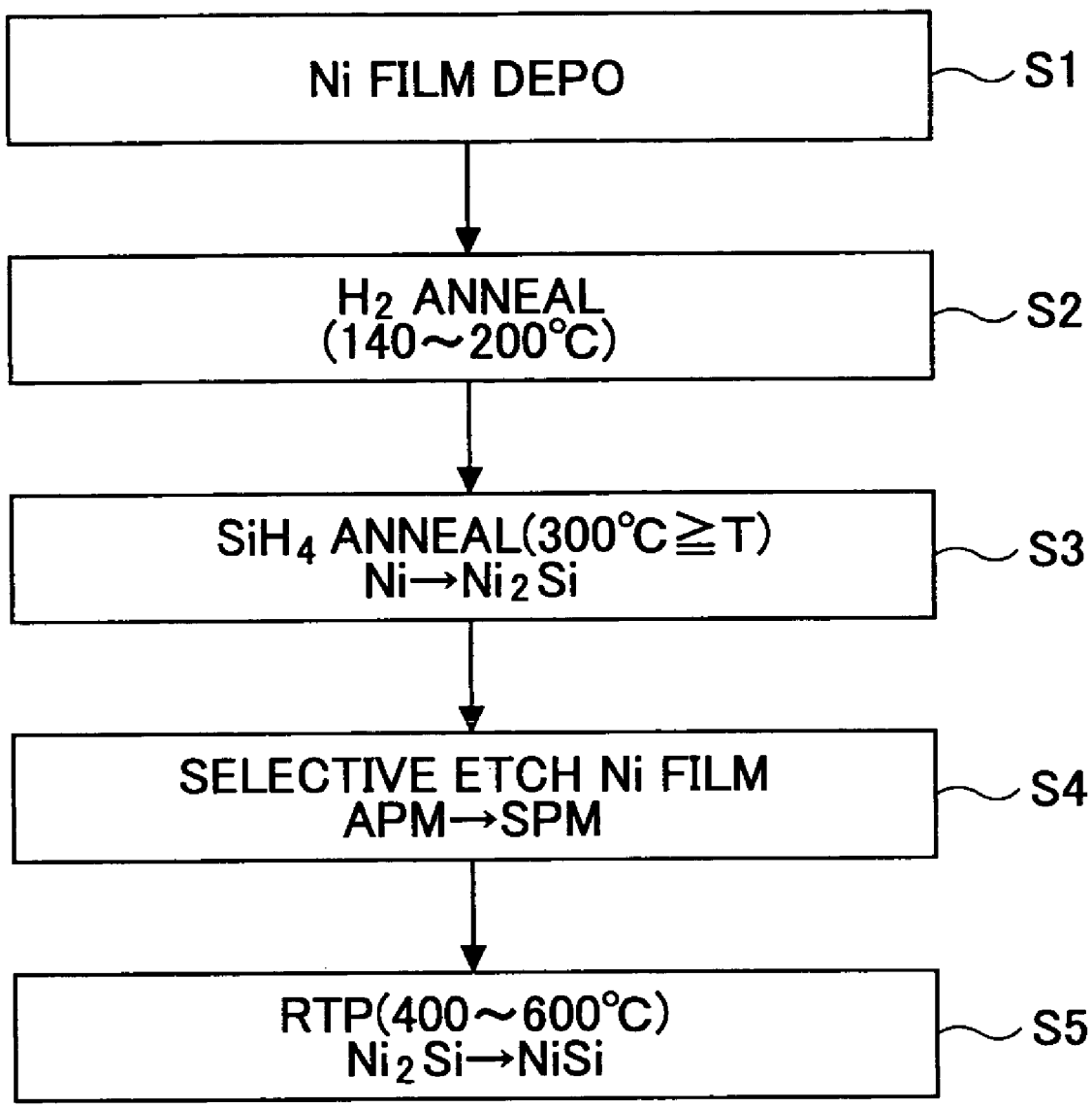
FIG. 2 is a flowchart showing the fabrication process of a semiconductor device corresponding to the steps of FIGS. 1H-1L.

FIGS. 1A-1L are diagrams showing the outline of the fabrication process of a semiconductor device 10 according to a first embodiment of the present invention, while FIG. 2 shows the flowchart corresponding to the steps of FIGS. 1H-1L.

Referring to FIG. 1A, the semiconductor device 10 is an n-channel MOS transistor formed on a silicon substrate 1, wherein the silicon substrate 1 is formed with a device region 1A by a device isolation region 11 of STI (shallow trench isolation) structure. The device region 1A is formed with a p-type well (not shown), for example.

Next, in the step of FIG. 1B, an SiON film 2 is formed on the silicon substrate 1 with a thickness of 1-2 nm, and a polysilicon film 3 is formed on the SiON film 2 in the step of FIG. 1C typically with a thickness of 100 nm.

Next, in the step of FIG. 1D, the polysilicon film 3 and the SiON film 2 underneath the polysilicon film 3 are subjected to a patterning process, and there are formed a polysilicon gate electrode 3G and an SiON gate insulation film 2G. In the illustrated example, the semiconductor device 10 is an n-channel MOS transistor of the 65 nm node or later, and thus, the polysilicon gate electrode 3G is formed with a gate length of 35 nm or less.

Next, in the step of FIG. 1E, P+ or As+ is introduced into the silicon substrate 1 by an ion implantation process conducted under the acceleration voltage of typically 1-5 keV with the dose of $5-9\times10^{14}$ $cm^{-2}$, and with this, diffusion regions $1a$ and $1b$ of n-type are formed in the silicon substrate 1 at respective sides of the gate electrode 3G as source and drain extension regions with a depth of typically 20 nm or less.

Next, in the step of FIG. 1F, sidewall insulation films 4A and 4B are formed on respective sidewall surfaces of the gate electrode 3G, and in the step of FIG. 1G, P+ or As+ is introduced into the silicon substrate 1 at respective outer sides of the sidewall insulation films 4A and 4B by an ion implantation process conducted under the acceleration voltage of 6-15 keV with the dose of $5 \times 10^{13}$-$10^{16}$ cm$^{-2}$ for the case of using P+ or under the acceleration voltage of 35-40 keV with the dose of $5 \times 10^{15}$ cm$^{-2}$ for the case of using As+, while using the gate electrode 3G and the sidewall insulation films 4A and 4B as a mask. With this, diffusion regions 1c and 1d of n$^+$-type are formed as source and drain regions of the n-channel MOS transistor.

Next, in the step of FIG. 1H, the structure of FIG. 1G is introduced into a sputtering apparatus (not shown) and a metallic nickel film 5 is formed on the structure of FIG. 1G in correspondence to the step 1 of the flowchart of FIG. 2 by a sputtering process, typically with a thickness of 10-50 nm while using a Ni target. With the present invention, it should be noted that the metallic nickel film 5 thus formed is not covered by a protective cap layer such as a TiN layer, contrary to the conventional art, in view of the silicide formation process to be conducted later.

Next, in the step of FIG. 1I, the structure of FIG. 1H is transferred from the sputtering apparatus to a film forming apparatus such as a low-pressure CVD apparatus, and a silicide forming reaction is conducted as will be explained below.

Meanwhile, because the surface of the metallic nickel film 5 is exposed in the case of the present invention as noted before, there is a possibility that a native oxide film is formed on the surface of the metallic nickel film 5 when the substrate to be processed is transferred from the sputtering apparatus to the film forming apparatus.

Thus, with the present invention, the structure of FIG. 1H is annealed, before starting the silicide forming process in the film forming apparatus, in a hydrogen ambient at the temperature of 140-200° C. for 30-60 seconds in the step of FIG. 1I corresponding to the step 2 of FIG. 2. With this, the native oxide film (not shown) on the metallic nickel film 5 is reduced to a metallic Ni.

Thereafter, the process proceeds to the step of FIG. 1J without exposing the substrate to the atmosphere, and the silicide forming step 3 of FIG. 2 is conducted while using the same film forming apparatus.

Thus, with the present invention, the structure of FIG. 1I is annealed in the step of FIG. 1J in a silane (SiH$_4$) gas ambient under the pressure of $1 \times 10^4$ Pa at the temperature of 140-220° C. for 60 seconds, and with this, the metallic nickel film 5 causes a reaction with the surface part of the source region 1c, the drain region 1d and the gate electrode 3G. As a result of the foregoing reaction, there are formed nickel silicide layers 6s, 6d and 6g of the composition primarily of Ni$_2$Si respectively on the source region 1c, the drain region 1d and the gate electrode 3G, typically with the thickness of 15-20 nm.

Further, in the step of FIG. 1J, it should be noted that a nickel silicide layer 6 of the Ni$_2$Si composition is formed on the entire surface of the metallic nickel film 5 as a result of the reaction with the thermal annealing ambient that contains the silane gas.

Because the nickel atoms in the metallic nickel film 5 are consumed by the formation of the nickel silicide layer 6 with the process of FIG. 1J, it should be noted that the diffusion of the nickel atoms from the metallic nickel film 5 to the source region 1c, the drain region 1d and the gate electrode 3G is effectively suppressed, and thus, the penetration depth of the Ni$_2$Si layers 6s and 6d formed on the surface of the source region 1c or the drain region 1d into the Si substrate 1 is limited to 20 nm or less as measured from the surface of the silicon substrate 1.

Referring to FIG. 1J, it will be noted that the silicide layer 6s on the source region 1c, the silicide layer 6d on the drain region 1d and the silicide layer 6g on the gate electrode 3G, are formed in continuation to the nickel silicide layer 6, wherein it should be noted that the silicide forming reaction is conducted such that not all the metallic nickel film 5 is converted to silicide for the part where the metallic nickel film 5 is formed on the device isolation film 1I or on the sidewall insulation films 4A and 4B. In other words, the silicide formation reaction is conducted in the step of FIG. 1J such that the metallic nickel film 5 remains continuously under the silicide layer 6 in the foregoing portions.

Thus, in the step of FIG. 1K corresponding to the step 4 of FIG. 2, the nickel silicide layer 6 of the composition of Ni$_2$Si on the surface of the metallic nickel film 5 is selectively dissolved at first by using an APM etchant of 65° C., containing a nitric acid (NH$_3$) and hydrogen peroxide water (H$_2$O$_2$) with the proportion of 3:1, followed by the selective dissolving process of the remaining metallic nickel film conducted by using an SPM etchant of 80° C. that contains a sulfuric acid (H$_2$SO$_4$) and hydrogen peroxide water (H$_2$O$_2$) with the proportion of 3:1.

As a result, very thin layers 6s, 6d and 6g of nickel silicide (Ni$_2$Si) are formed on the respective surfaces of the source region 1c, the drain region 1d and the polysilicon gate electrode 3G.

Next, in the step of FIG. 1L corresponding to the step 5 of FIG. 2, the structure of FIG. 1K is annealed in an inert gas ambient such as Ar or N$_2$ at 320-600° C. for 30 seconds. With this, the silicide layers 6s, 6d and 6g of the composition of Ni$_2$Si are converted respectively to low-resistance silicide layers 6S, 6D and 6G of the composition of NiSi.

Figure 3:
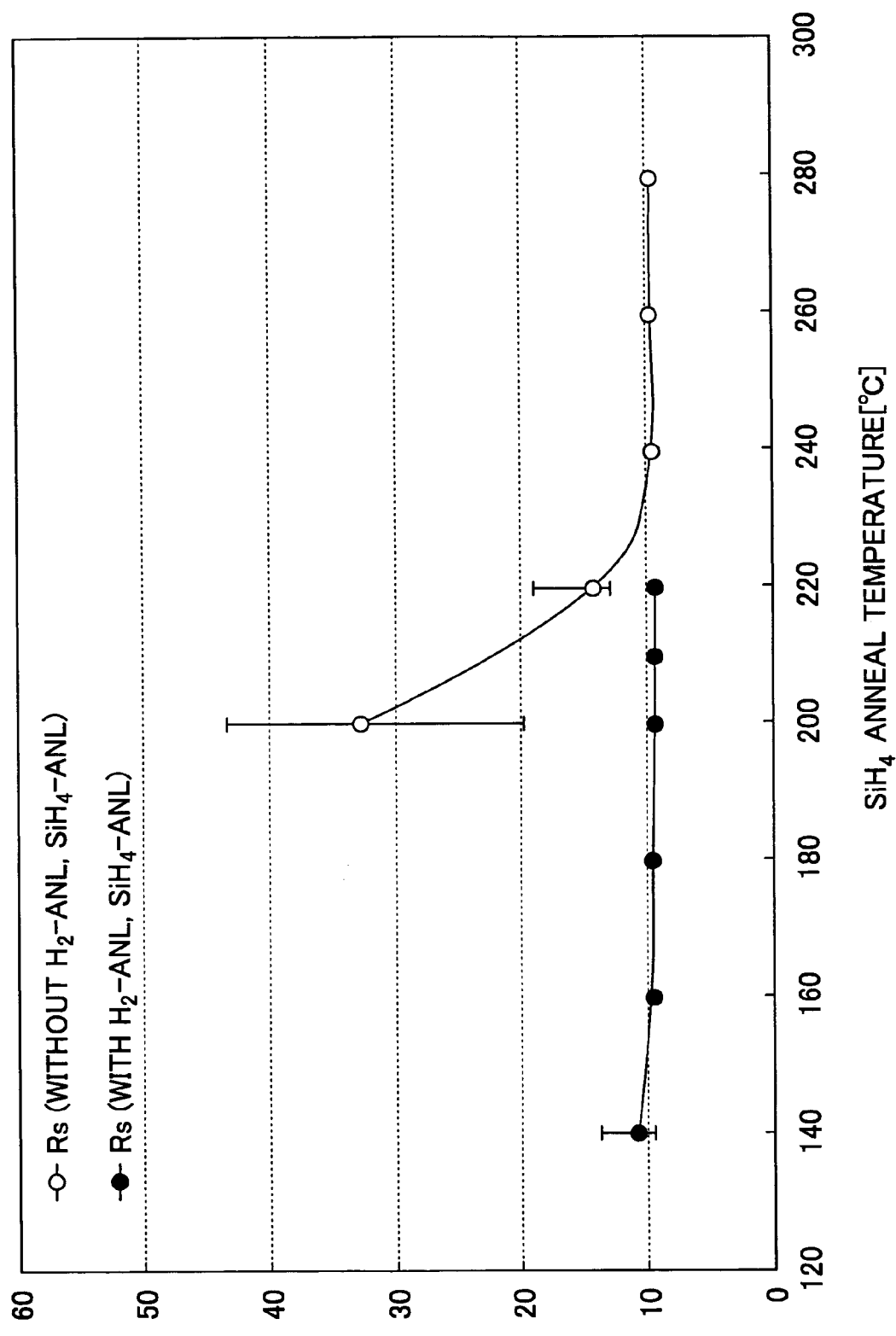
FIG. 3 is a diagram showing the sheet resistance of the silicide layer for the case the step 2 of FIG. 2 is conducted and the case the step 2 is omitted.

FIG. 3 shows the relationship between the temperature of the annealing step of FIG. 1J conducted in the silane gas ambient and the sheet resistance of the NiSi silicide film obtained in the step of FIG. 1L, for the case the step 2 of FIG. 2, and thus the reducing processing in the hydrogen ambient of FIG. 1I, is conducted, in comparison with the case in which no such a hydrogen annealing step is conducted.

Referring to FIG. 3, it will be noted that the desired low sheet resistance is not attained in the case the reducing processing in the hydrogen ambient is omitted, unless the thermal annealing processing in the silane gas ambient is conducted at a temperature exceeding 220° C.

In the case the reducing processing in the hydrogen ambient is conducted, on the other hand, it can be seen that a very low sheet resistance of about 10Ω/☐ is attained even when the thermal annealing process in the silane gas ambient is conducted at the temperature of 220° C. or less.

The experiment of FIG. 3 was conducted by using a test substrate.

Figure 4:
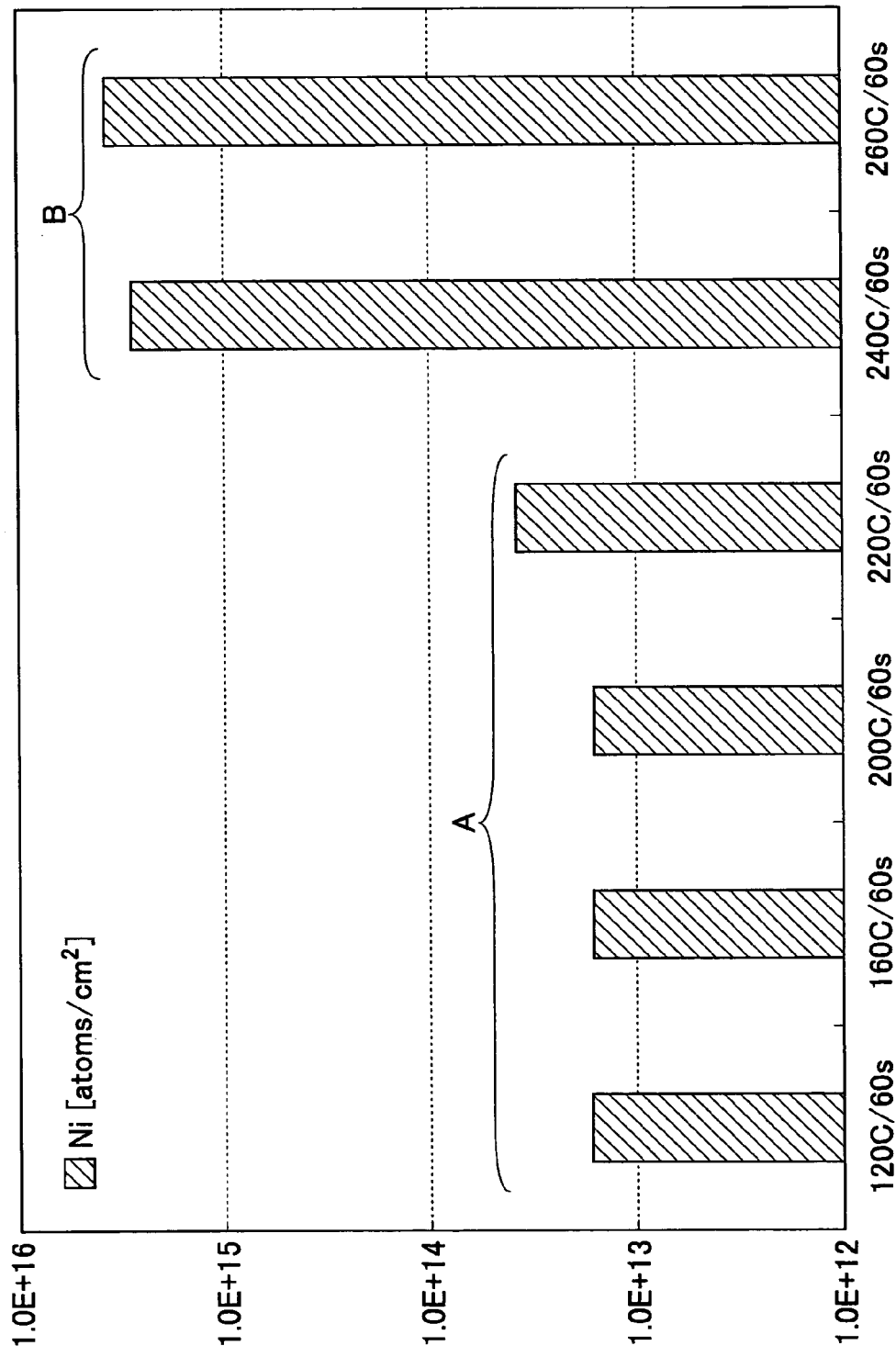
FIG. 4 is a diagram showing the effect of annealing temperature of the step 3 of FIG. 2 on the selective etching process of the step 4 of FIG. 2.

FIG. 4 shows the proportion of the nickel silicide film remaining after the step 4 of FIG. 2, and thus after the etching step of FIG. 1K, for the case the step 3 of FIG. 2, and thus the thermal annealing process in the silane gas of FIG. 1J, is conducted at various temperatures. The experiment of FIG. 4 was also conducted with regard to a test substrate.

More specifically, a silicon oxide film is formed uniformly on a silicon substrate surface, and a metallic nickel film is deposited uniformly in a step corresponding to the step 1 of FIG. 2. Further, a reducing processing is applied to the surface of the metallic nickel film in the step corresponding to the step 2 of FIG. 2, and thermal annealing process is conducted in the SiH$_4$ ambient at various temperatures.

Thereby, a surface silicide layer having the composition primarily of Ni$_2$Si is formed on the surface of the metallic nickel film, and the surface silicide layer thus formed and the residual metallic nickel film underneath the surface silicide layer are removed by dissolving into APM and SPM etchant.

Further, the amount of the residual nickel atoms is obtained by using a total reflection X-ray fluorescent analysis.

Referring to FIG. 4, it will be noted that, in the case the temperature is set to 220° C. or lower in the thermal annealing process of FIG. 1J corresponding to the step 3 of FIG. 2, the number of the Ni atoms per unit area or surface density detected after the selective etching process is merely in the order of about $1\times10^{13}$ cm$^{-2}$, while in the experiment in which the thermal annealing processing is conducted at the temperature exceeding 220° C. such as 240° C., it will be noted that the surface density of the remaining nickel atoms exceeds the value of $1\times10^{15}$ cm$^{-2}$ indicating that no substantial removal of nickel silicide is caused by the selective etching process conducted by using APM and SPM etchant. This means that, in the step of FIG. 1J, the entire metallic nickel film has caused the silicide formation reaction.

In order to ensure that no nickel silicide film remains on oxide layers after the selective etching step of FIG. 1K, and hence the step 4 of FIG. 2, that resolves the metallic nickel film 5, it is necessary to carry out the thermal annealing process of FIG. 1J, and hence the step 3 of FIG. 2, at the temperature of 220° C. or less.

Further, the present invention carries out the removal process of removing oxide film from the surface of the metallic nickel film 5 in the step of FIG. 1I. With this, it becomes possible to carry out the thermal annealing process of FIG. 1J at the temperature of 220° C. or less.

While a hydrogen gas was used with the step of FIG. 1I for the reducing gas, the reducing gas of the step of FIG. 1I is by no means limited to a hydrogen gas but it is also possible to use other reducing gas such as an ammonia gas.

Further, with the step of FIG. 1J, the silane gas is not limited to the monosilane ($SiH_4$) gas, but it is also possible to use other silane gas such as a disilane ($Si_2H_6$) gas.

Further, in the step of FIG. 1H, it is also possible to form the metallic nickel film 5 by a process other than the sputtering process, such as electron beam evaporation deposition process.

Second Embodiment

Next, fabrication process of a CMOS device according to a second embodiment of the present invention will be described with reference to FIGS. 5A-5F.

Figure 5A:
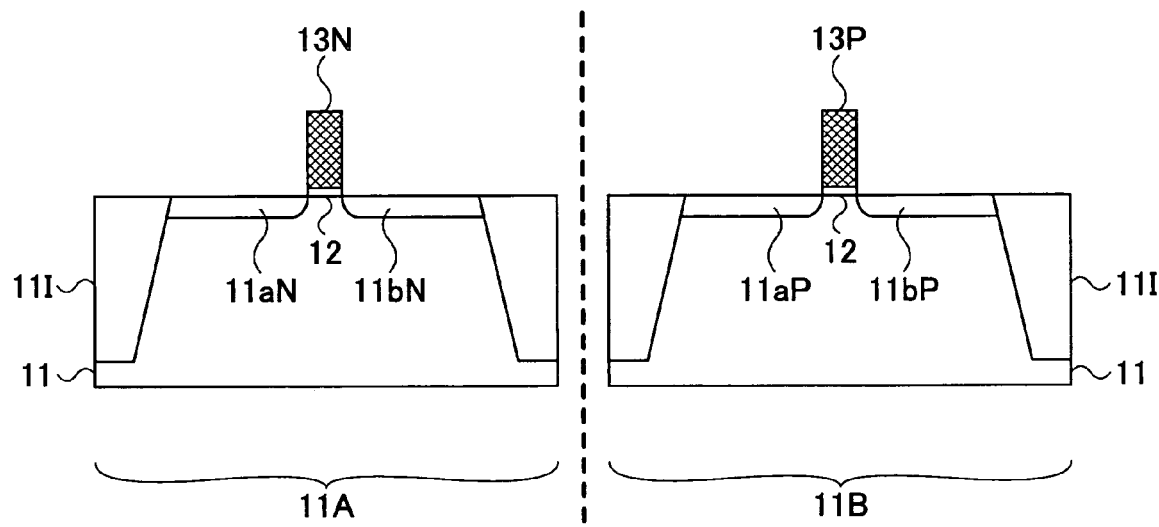
FIGS. 5A-5F are diagrams showing the fabrication process of a semiconductor device according to a second embodiment of the present invention.

Referring to FIG. 5A, a silicon substrate 11 is defined with a device region 11A for an n-channel MOS transistor and a device region 11B for a p-channel MOS transistor by an STI device isolation structure 11I, wherein the device region 11A is doped to p-type and forms a p-type well while the device region 11B is doped to n-type and forms an n-type well. Further, while not illustrated, there is conducted an ion implantation of a p-type impurity element in the device region 11A at a surface part of the silicon substrate 11 for the purpose of threshold control of the n-channel MOS transistor. Similarly, there is conducted an ion implantation of an n-type impurity element in the device region 11B at a surface part of the silicon substrate 11 for the purpose of threshold control of the p-channel MOS transistor.

On the device region 11A, there is formed a polysilicon gate electrode 13N via a gate insulation film 12 of thermal oxide film or SiON film, or alternatively a high-K dielectric. Similarly, a polysilicon gate electrode 13P is formed on the device region 11B via the same gate insulation film 12, wherein it should be noted that source and drain extension regions 11aN and 11bN of n-type are formed in the silicon substrate 11 in correspondence to the device region 11A at both lateral sides of the polysilicon gate electrode 13N and source and drain extension regions 11aP and 11bP of p-type are formed in the silicon substrate 11 in correspondence to the device region 11B at both lateral sides of the polysilicon gate electrode 13P, by introducing an n-type impurity element and a p-type impurity element separately into the device regions 11A and 11B by an ion implantation process while using the gate electrode 13N or 13P as a self-aligned mask. In the case of introducing an n-type impurity element, As+ may be introduced under an acceleration voltage of 1 keV with a dose of $2\times10^{15}$ cm$^{-2}$. In the case of introducing a p-type impurity element, B+ may be introduced under an acceleration voltage of 0.3 keV with a dose of $1\times10^{15}$ cm$^{-2}$.

Here, it should be noted that the SiON film used for the gate insulation film may be formed by plasma nitridation of a thermal oxide film or by a direct plasma CVD process. Further, in the case a high-K dielectric film is used for the gate insulation film, it is possible to use a metal oxide such as $HfO_2$, $ZrO_2$ or $Al_2O_3$ or a metal silicate such as $HfSiO_4$ or $ZrSiO_4$, wherein these high-K dielectric films may be formed by an MOCVD process or atomic layer CVD process (so-called ALD process).

Figure 5B:
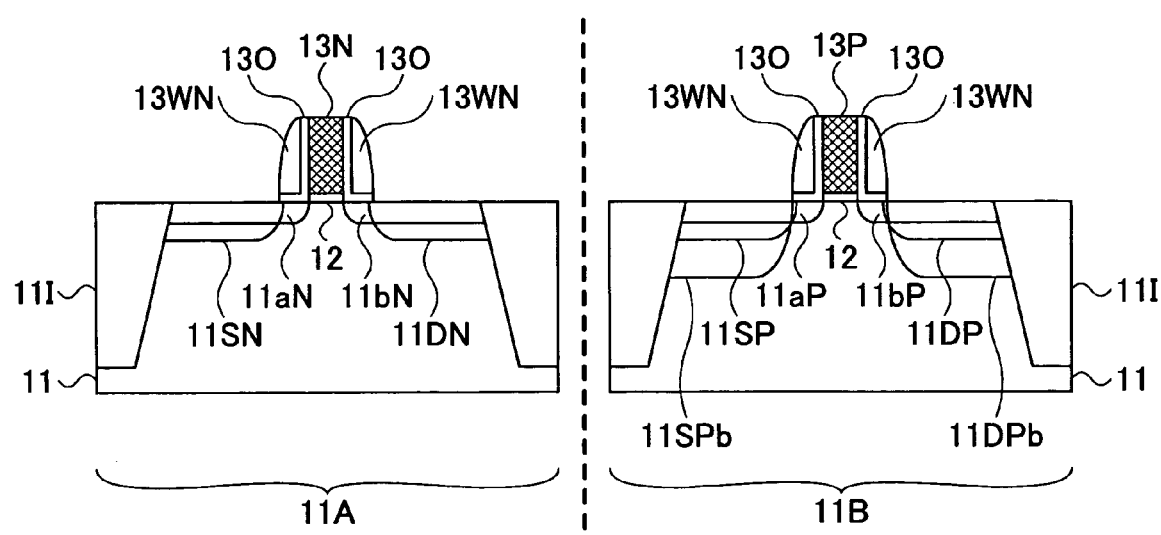

Next, in the step of FIG. 5B, a CVD oxide film 13O is formed on the surface of the silicon substrate 11 so as to cover the polysilicon gate electrodes 13N and 13P with a thickness of about 10 nm such that the CVD oxide film 13 covers the exposed surface of the silicon substrate 11 and the surface of the polysilicon gate electrodes 13N and 13P continuously. Following this, formation of a sidewall insulation film 13WN on the sidewall surface of the polysilicon gate electrodes 13N and 13P is made via the CVD oxide film 13O, such that the sidewall insulation films 13WN have resistance against dry and wet etching of silicon and further against HF processing, by using a material such as SiON or SiN with the thickness of 30 nm, for example.

It should be noted that such a sidewall insulation film 13WM can be formed by depositing an SiON film or an SiN film on the structure of FIG. 5A by a low temperature process of 600° C. or lower such that there is caused no disturbance in the impurity concentration profile in the foregoing source and drain extension regions, followed by an etch back process conducted until the surface of the silicon substrate 11 is exposed.

Further, in the step of FIG. 5B, the device region 11B is covered with a resist film not illustrated, and an n-type impurity element such as As+ is introduced under the acceleration voltage of 10 keV with a dose of $3\times10^{15}$ cm$^{-2}$ while using the gate electrode 13N, the sidewall oxide films 13O, and the sidewall insulation films 13WN as a mask. With this, deep n-type diffusion regions are formed at the respective outer sides of the sidewall insulation films 13WN as the source and drain regions 11SN and 11DN of the n-channel MOS transistor.

Further, in the step of FIG. 5B, the device region 11A is covered with a resist film not illustrated, and a p-type impurity element such as B+ is introduced under the acceleration voltage of 3 keV with a dose of $1\times10^{15}$ cm$^{-2}$ while using the gate electrode 13P, the sidewall oxide films 13O and the sidewall insulation films 13WN as a mask. With this, deep p-type diffusion regions are formed at the respective outer sides of the sidewall insulation films 13WN as the source and drain regions 11SP and 11DP of the p-channel MOS transistor.

Further, in the step of FIG. 5B, buffer source and drain regions 11SPb and 11DPb of p$^-$-type are formed respectively underneath the p-type source and drain regions 11SP and 11DP for the purpose of improving the breakdown voltage of the source and drain regions 11SP and 11DP, by conducting an ion implantation process of a p-type impurity element such as B+ into the device region 11B with a larger acceleration voltage of 10 keV and smaller dose of $1\times10^{13}$ cm$^{-2}$, while using the polysilicon gate electrode 13P, the sidewall oxide films 13O, and the sidewall insulation films 13WN as a mask.

Figure 5C:
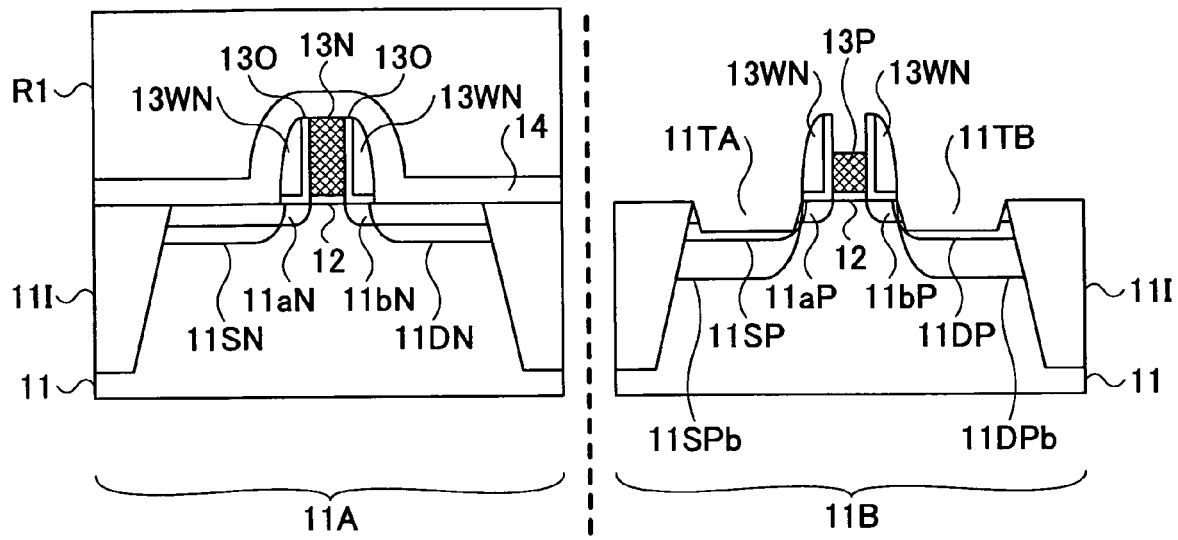

Next, in the step of FIG. 5C, a silicon oxide film 14 is formed on the structure of FIG. 5B by a CVD process with a thickness of 50 nm, followed by removal of the silicon oxide film 14 from the device region 11B in the state that the device region 11A is covered by a resist mask R1.

Further, in the step of FIG. 5C, a dry etching process or a wet etching process that uses an organic alkaline etchant is applied to the silicon substrate 11 in the device region 11B in the state that the device region 11A is covered with the resist mask R1 while using the polysilicon gate electrode 13P and the sidewall insulation films 13WN as a self-aligned mask. Here, it is possible to use the dry etching process and wet etching process may be conducted in appropriate combination.

Further, in the step of FIG. 5C, trenches 11TA and 11TB are formed at respective outer sides of the sidewall insulation films 13WN with a depth not exceeding the depth of the source and drain regions 11SP and 11DP, such as the depth of 40 nm. Here, it should be noted that this step of forming the trenches 11TA and 11TB can be conducted after removal of the resist mask R1.

After formation of the trenches 11TA and 11TB, the structure thus obtained is subjected to a wet etching process by using HF, and the impurities such as etching residue are removed from the bottom surface and sidewall surface of the trenches 11TA and 11TB.

Further, in the step of FIG. 5C, it should be noted that the polysilicon gate electrode 13P undergoes partial etching with the formation of the trenches 11TA and 11TB in the silicon substrate 11.

Figure 5D:
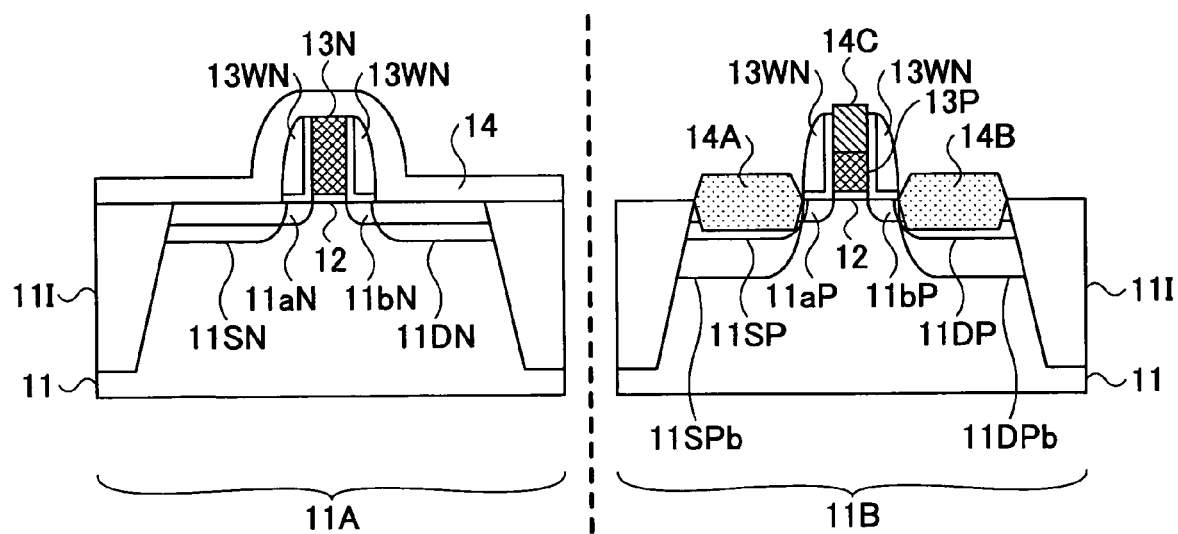

Next, in the step of FIG. 5D, the resist film R1 is removed, and the structure thus obtained is introduced into a low-pressure CVD apparatus. Thereby, source gases of silane (SiH$_4$) and germane (GeH$_4$) are introduced together with a p-type dopant gas such as diborane at the substrate temperature of 600° C. or less, and p-type SiGe mixed crystal layers 14A and 14B are grown epitaxially so as to fill the trenches 11TA and 11TB.

For example, the growth of such SiGe mixed crystal layers 14A and 14B can be conducted at the substrate temperature of 550° C. in hydrogen ambient of 5-1330 Pa by supplying the SiH$_4$ source gas, the GeH$_4$ source gas, the B$_2$H$_6$ dopant gas, and further a hydrogen chloride (HCl) etching gas, such that there is realized a partial pressure of 1-10 Pa for the SiH$_4$ source gas, a partial pressure of 0.1-10 Pa for the GeH$_4$ source gas, a partial pressure of $1\times10^{-5}$-$1\times10^{-3}$ Pa for the B$_2$H$_6$ dopant gas, and a partial pressure of 1-10 Pa for the HCl etching gas.

With the epitaxial growth of the p-type SiGe mixed crystal layers 14A and 14B, there is caused a growth of a p-type polycrystalline SiGe layer on the polysilicon gate electrode 13P. Thereby, it should be noted that the growth of the SiGe layers 14A-14C is conducted for 1-40 minutes, and as a result, the SiGe mixed crystal layers 14A and 14B filling the respective trenches 11TA and 11TB are grown beyond the level of the interface between the silicon substrate 11 and the gate insulation film 12.

As a result of the formation of the SiGe mixed crystal layers 14A and 14B, a large uniaxial compressive stress is applied to the channel region right underneath the gate insulation film 12, and there is caused a significant increase of mobility for the holes transported through the channel region.

Further, because the low temperature growth is made over a limited area with the present invention, it is confirmed that the SiGe layers 14A and 14B thus grown can contain Ge with an atomic concentration level of 28%, without deteriorating the crystal quality, wherein it should be noted that this concentration of 28% exceeds the atomic concentration of 20%, which has been recognized as the limiting concentration of Ge that a SiGe layer can contain when to cause epitaxial growth of such a SiGe layer on a silicon substrate.

With the structure of FIG. 5D, it should be noted that the trenches 11TA and 11TB are formed in the step of FIG. 5C while using the sidewall insulation film 13WN as a self-aligned mask. Thus, the SiGe mixed crystal layers 14A and 14B thus formed are located closest to the channel region, and it becomes possible to maximize the uniaxial compressive stress applied to the channel region.

Further, in the step of FIG. 2E, the CVD oxide film 14 remaining in the device region 11A is etched back until the surface of the silicon substrate 11 is exposed, and as a result, there are formed outer sidewall oxide films 14W in the device region 11A at further outer sides of the SiN sidewall insulation films 13WN on the gate electrode 13N, and buffer source and drain regions 11SNb and 11Dnb of n$^-$-type are formed in the silicon substrate at a deeper level of the source and drain regions 11SN and 11DN by conducting an ion implantation process of an n-type impurity element such as P+ into the device region 11B under the acceleration voltage of 15 keV with a dose of $7\times10^{13}$ cm$^{-2}$ in the state the device region 11B is covered by a resist mask not illustrated while using the polysilicon gate electrode 13N, the sidewall oxide films 13O, the sidewall insulation films 13NW and the outer sidewall oxide films 14W as a mask.

By forming such buffer source and drain regions 11SNb and 11DNb at further outer sides of the outer sidewall oxide films 14W, it becomes possible with the present embodiment to secure a sufficient distance between the diffusion regions 11SNb and 11DNb, and occurrence of leakage current via such diffusion regions is effectively suppressed.

Figure 5E:
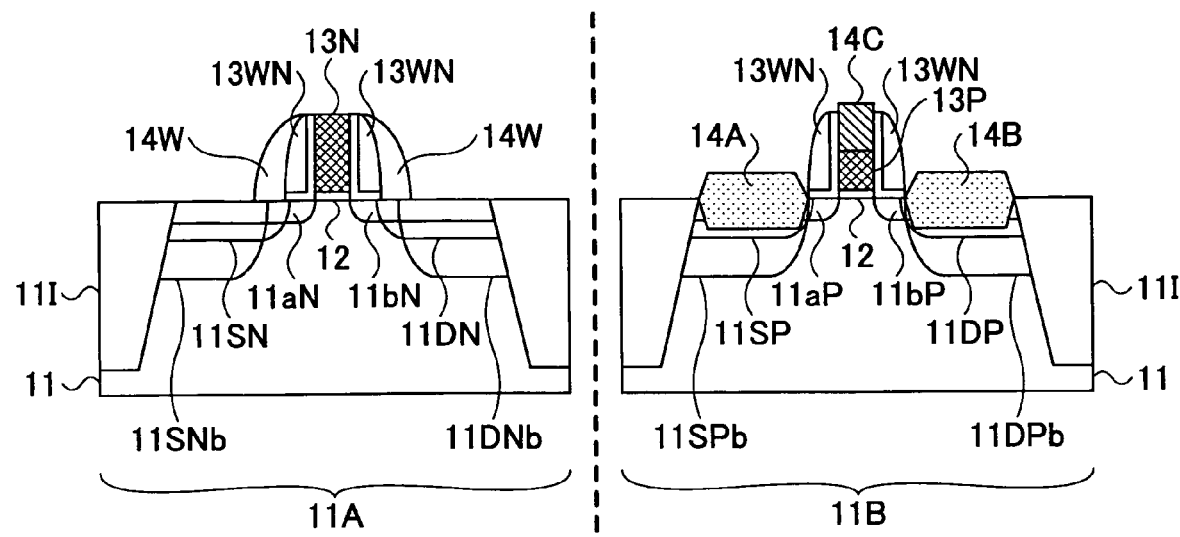

After the step of FIG. 5E, a salicide process is conducted, and silicide layers 16S, 16D and 16G of nickel silicide are formed respectively on the n-type source and drain regions 11SN and 11DN, p-type source and drain regions 11SP and 11DP, the n-type polysilicon gate electrode 13N and the p-type polysilicon gate electrode 13P.

Thus, according to the present invention, it becomes possible to construct a high speed CMOS device by forming an n-channel MOS transistor and a p-channel MOS transistor on a common substrate.

Figure 5F:
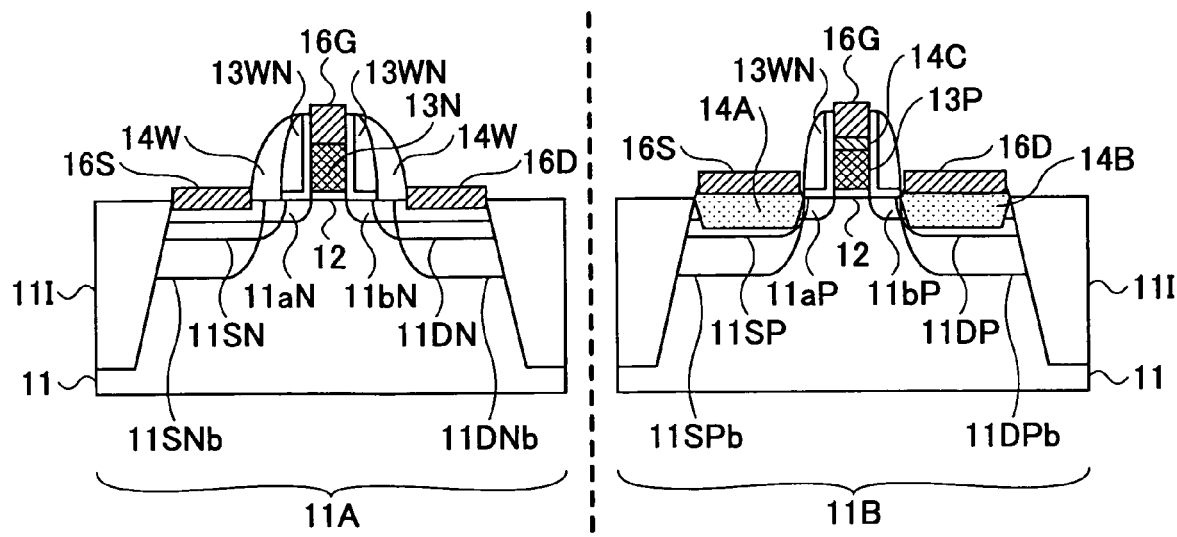

FIGS. 6A-6E show the process of FIG. 5F in detail.

Figure 6A:
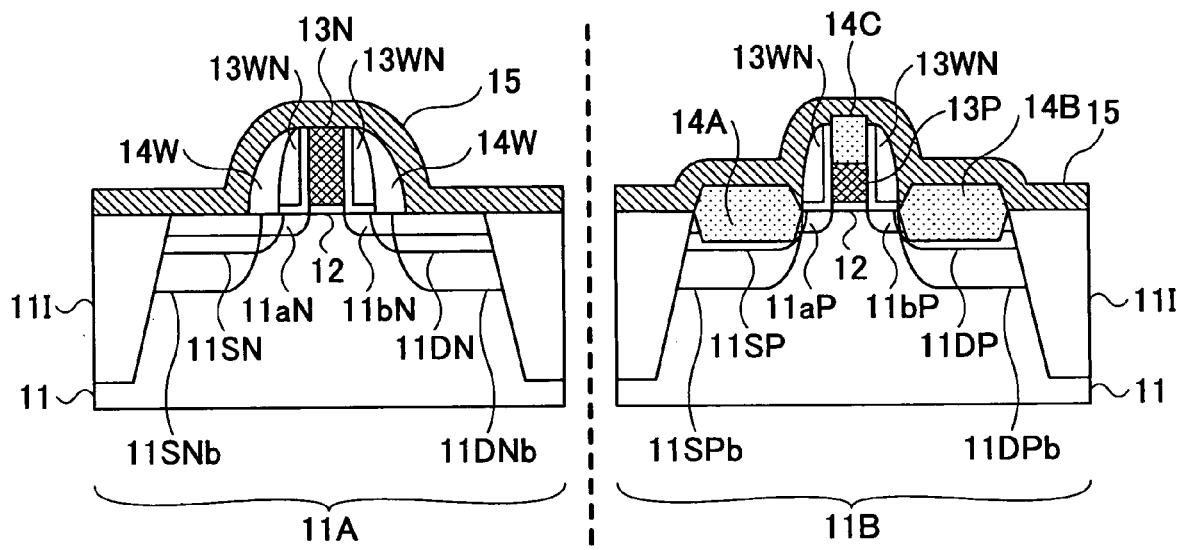

Referring to FIG. 6A, a metallic nickel film 15 is deposited on the structure of FIG. 5E by a sputtering process or electron beam evaporation deposition process with a thickness of about 10 nm.

Figure 6B:
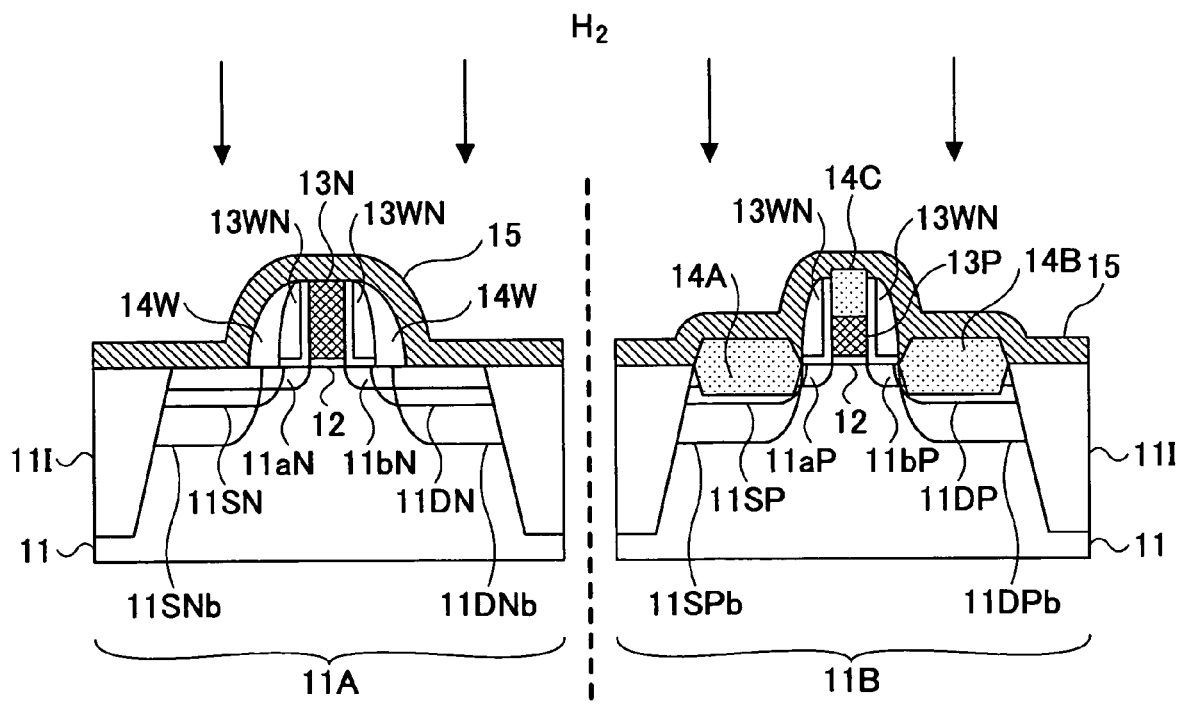

Next, in the step of FIG. 6B, the structure of FIG. 6A is introduced to a CVD apparatus, which may be a low-pressure CVD apparatus, and oxide film on the surface of the metallic nickel film 15 is removed by a thermal annealing process conducted in a hydrogen ambient under the pressure of $1\times10^4$ Pa at the temperature of 140-200° C. for the duration of 30-60 seconds.

Next, in the step of FIG. 6C, a thermal annealing process is applied in continuation to the step of FIG. 6B in the gas ambient of silane (SiH$_4$) or disilane (Si$_2$H$_6$) under the pressure of $1\times^4$ Pa at the temperature of 140-220° C. for 60 seconds while using the same CVD apparatus, and as a result, a nickel silicide layer 16s primarily of Ni$_2$Si is formed on the source region 11SN of the n-channel MOS transistor and the source region 11SP of the p-channel MOS transistor. Further, a similar nickel silicide layer 16d is formed on the drain region 11DN of the n-channel MOS transistor and the drain region 11DP of the p-channel MOS transistor, and a similar nickel silicide layer 16g is formed on the gate electrode 13N of the n-channel MOS transistor and on the gate electrode 13P of the p-channel MOS transistor.

Further, in the step of FIG. 6C, a nickel silicide layer 16 primarily of $Ni_2Si$ is formed uniformly on the surface of the metallic nickel film 15 as a result of reaction with the silane gas.

Next, in the step of FIG. 6D, the nickel silicide layer 16 formed on the surface of the metallic nickel film 15 is removed selectively by an APM etchant of 65° C., and the remained metallic nickel film 15 is removed selectively by an SPM etchant of 80° C. Thereby, because conversion of the entire metallic nickel film 15 to silicide is avoided as a result of setting of the anneal temperature of the step of FIG. 6C to 220° C. or lower, it becomes possible to form the nickel silicide layers 16s, 16d and 16g on the respective locations of the n-channel and p-channel MOS transistors after the selective etching process of FIG. 6D.

Figure 6E:
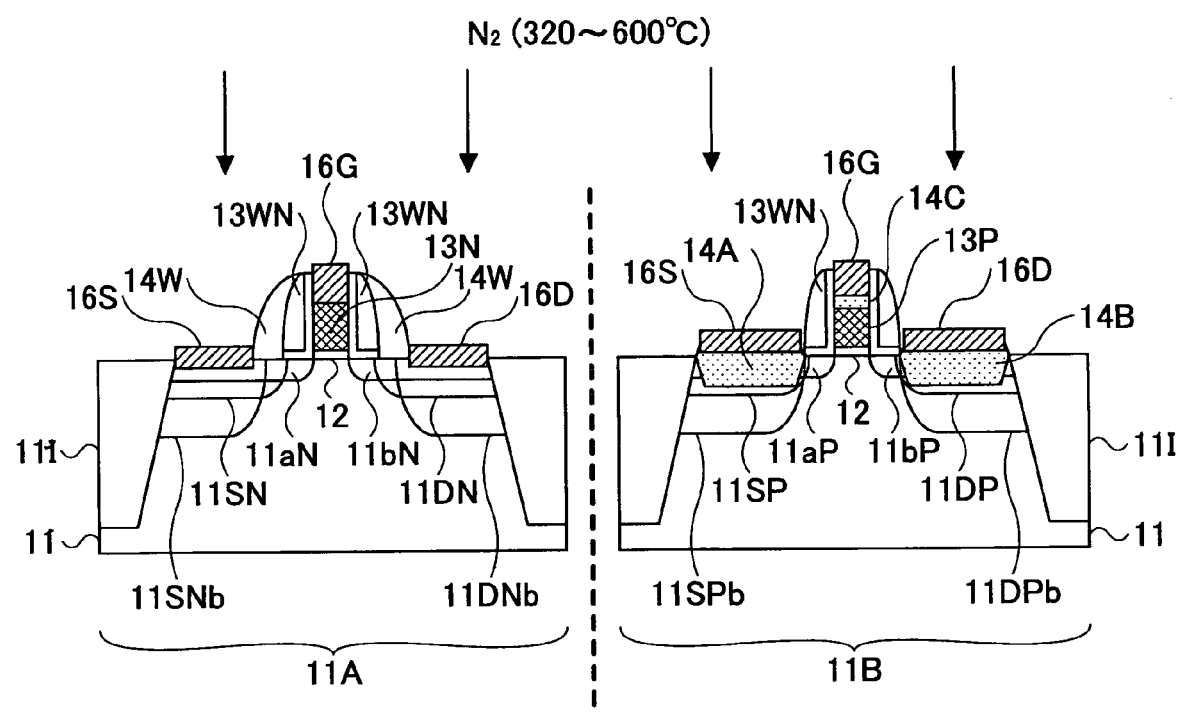

Further, in the step of FIG. 6E, the structure of FIG. 6D is annealed in an inert gas ambient such as Ar or $N_2$ at the temperature of 320-600° C., typically 400° C., for 30 seconds, the nickel silicide layers 16s, 16d and 16g of the composition primarily of Ni2Si are converted to the silicide layers 16S, 16D and 16G of nickel monosilicide (NiSi), respectively.

According to the present invention, it becomes possible to induce a uniaxial compressive stress working upon the channel region right underneath the gate insulation film 12 in the direction parallel to the substrate surface, by forming the SiGe epitaxial regions 14A and 14B having a lattice constant larger than the silicon substrate 11 in correspondence to the source and drain regions of the p-channel MOS transistor formed in the device region 11B.

Thereby, it should be noted that formation of the low-resistance silicide layers 16S and 16D becomes possible on such SiGe mixed crystal regions 14A and 14B with reliability as a result of use of nickel silicide. Because the penetration depth of the low-resistance silicide layers 16S and 16D into the underlying silicon layer is limited within 20 nm as a result of using the silane ambient in the silicide formation process of FIG. 6C, similarly to the previous embodiments, and the problem of the silicide layers 16S and 16D causing short circuit with the well forming the device region via the shallow source diffusion region or drain diffusion region is successfully avoided.

Particularly, it is possible with the present invention to expose a crystal surface such as Si(111) surface at the sidewall surface of the trenches 11TA and 11TB, by using a wet etching process in the trench formation step of FIG. 5C, and it becomes possible with the process of FIG. 5D to improve the quality of the SiGe mixed crystal layers 14A and 14B thus grown epitaxially.

Further, by combining a dry etching process and a wet etching in the foregoing step of forming the trenches, it becomes possible to form the sidewall surfaces of the trenches 11TA and 11TB to have the shape of a wedge invading toward the channel region right underneath the gate insulation film 12, as shown in FIG. 5D. In this case, the tip end part of the SiGe mixed crystal layers 14A and 14B filling the trenches 11TA and 11TB invade into the regions right underneath the respective sidewall insulation films 13WN and thus comes very close to the channel region. Thereby, the magnitude of the uniaxial compressive stress in the channel region is increased further and the operational speed of the p-channel MOS transistor is increased further.

Furthermore, by forming diffusion region 11SPb and 11DPb of $p^-$-type respectively underneath the p-type source and drain regions 11SP and 11DP in the device region 11B in the process of FIG. 5B of the present embodiment, it becomes possible to avoid sharp change of impurity concentration at the p/n junction right underneath the p-type source and drain regions 11SP and 11DP even in the case the SiGe mixed crystal layers 14A and 14B are formed with high dopant concentration by supplying a dopant gas during the epitaxial growth process, and the problem such as increase of the junction capacitance or degradation of the breakdown voltage is successfully avoided.

Further, while description has been made heretofore with regard to the case of a MOS transistor and a CMOS device formed on a bulk silicon substrate, the present invention is effective also in a MOS transistor or a CMOS device formed on an SOI substrate.

Further, the present invention is not limited to the embodiments described heretofore, but various variations and modifications may be made without departing from the scope of the invention.

What is claimed is:

1. A method of fabricating a semiconductor device including the step of forming a nickel monosilicide layer on a silicon surface defined by an insulation film selectively with a self-aligned process, comprising the steps of:
    forming a metallic nickel film on a silicon substrate such that said metallic nickel film covers said insulation film and said silicon surface;
    annealing said silicon substrate in a silane gas ambient at a temperature not exceeding 220° C. to form a first nickel silicide layer having a composition primarily of $Ni_2Si$ on said silicon surface and also on a surface of said metallic nickel film;
    removing said metallic nickel film after said step of forming first nickel silicide layer by a wet etching process; and
    converting said first nickel silicide layer to a second nickel silicide layer primarily of nickel monosilicide (NiSi) by applying a thermal annealing process.

2. The method as claimed in claim 1, further comprising, after the step of forming said metallic nickel film, the step of annealing said metallic nickel film in a reducing ambient to remove an oxide film on said surface of said metallic nickel film.

3. The method as claimed in claim 1, wherein said metallic nickel film is formed with a film thickness of 10-50 nm.

4. The method as claimed in claim 3, wherein said reducing gas is a hydrogen gas, and said step of removing said oxide film is conducted at a temperature of 140-200° C.

5. The method as claimed in claim 1, wherein said silane gas is a monosilane gas or a disilane gas.

6. The method as claimed in claim 2, wherein said annealing step in said reducing ambient and said step of forming said first silicide layer are conducted in continuation in an identical processing apparatus.

7. A method of fabricating a semiconductor device, comprising:
    forming a device isolation structure on a substrate such that said device isolation structure defines a device region in the form of a silicon surface;
    forming a gate electrode over said device region via a gate insulation film formed on said silicon surface in said device region;

forming first and second sidewall insulation films on respective sidewall surfaces of said gate electrode;

forming a source region and a drain region of an identical conductivity type in said silicon substrate at respective outer sides of said first sidewall insulation film and said second sidewall insulation film; and forming first and second nickel monosilicide layers primarily of NiSi on respective surfaces of said source and drain regions, wherein said step of forming said first and second nickel monosilicide layers comprises the steps of:

depositing a metallic nickel film on said substrate to cover said first and second diffusion regions and further said gate electrode including said first and second sidewall insulation films;

annealing said metallic nickel film in a silane gas ambient at a temperature not exceeding 220° C. to form a first nickel silicide layer, a second nickel silicide layer and a third nickel silicide layer of a composition primarily of $Ni_2Si$ respectively on a surface of said source region, a surface of said drain region and also on a surface of said metallic nickel film, removing, after said step of forming said first through third nickel silicide layers, said metallic nickel film by a wet etching process together with said third nickel silicide film; and converting said first and second nickel silicide layers of said source and drain regions respectively to first and second nickel monosilicide layers by conducting a thermal annealing process.

8. The method as claimed in claim 7, further comprising, after formation of said metallic nickel film but before formation of said first through third nickel silicide layers, the step of removing an oxide film on said surface of said metallic nickel film by annealing said metallic nickel film in a reducing ambient.

9. The method as claimed in claim 7, wherein said metallic nickel film is formed with a thickness of 10-50 nm.

10. The method as claimed in claim 8, wherein said reducing gas is a hydrogen gas and said step of removing said oxide film is conducted at a temperature of 140-200° C.

11. The method as claimed in claim 7, wherein said silane gas is any of a monosilane gas and a disilane gas.

12. The method as claimed in claim 8, wherein said thermal annealing step in said reducing ambient and said step of forming said first through third silicide layers are conducted in continuation in an identical processing apparatus.

13. The method as claimed in claim 7, wherein said step of forming said source and drain regions includes the step of conducting an ion implantation process while using said gate electrode and said first and second sidewall insulation films as a mask.

14. The method as claimed in claim 7, wherein said source and drain regions comprises a SiGe mixed crystal layer.

15. The method as claimed in claim 14, wherein said step of forming said source and drain regions comprises the step of etching said silicon surface on said device region at respective outer sides of said first and second sidewall insulation films to form first and second trenches at respective outer sides of said first and second sidewall insulation films, and growing said SiGe mixed crystal layer epitaxially in said first and second trenches.

* * * * *